United States Patent
Ruehrig

(10) Patent No.: US 7,566,941 B2
(45) Date of Patent: Jul. 28, 2009

(54) MAGNETORESISTIVE MEMORY CELL AND PROCESS FOR PRODUCING THE SAME

(75) Inventor: Manfred Ruehrig, Eckental (DE)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 11/412,067

(22) Filed: Apr. 27, 2006

(65) Prior Publication Data

US 2006/0291275 A1  Dec. 28, 2006

Related U.S. Application Data

(63) Continuation of application No. PCT/DE2004/002395, filed on Oct. 27, 2004.

(30) Foreign Application Priority Data

Oct. 28, 2003  (DE) ............................... 103 50 161

(51) Int. Cl.
H01L 29/78 (2006.01)

(52) U.S. Cl. .................. 257/421; 438/295; 360/110; 365/157; 365/94; 365/80; 365/63; 365/78; 257/E21.665

(58) Field of Classification Search ............. 257/421, 257/21.665; 360/110; 365/8, 45, 49, 33, 365/63, 78, 80, 94, 157, 158; 438/295
See application file for complete search history.

(56) References Cited

U.S. PATENT DOCUMENTS

| 5,986,858 | A | 11/1999 | Sato et al. |
| 6,110,751 | A | 8/2000 | Sato et al. |
| 6,111,729 | A | 8/2000 | Kamiguchi et al. |
| 6,118,624 | A | 9/2000 | Fukuzawa et al. |
| 6,636,399 | B2 | 10/2003 | Iwasaki et al. |
| 6,944,049 | B2* | 9/2005 | Hoenigschmid et al. .... 365/158 |
| 6,992,342 | B2* | 1/2006 | Motoyoshi et al. .......... 257/295 |
| 2001/0024388 | A1 | 9/2001 | Schwarzl |
| 2002/0044396 | A1 | 4/2002 | Amano et al. |
| 2003/0185046 | A1 | 10/2003 | Nishiyama et al. |

FOREIGN PATENT DOCUMENTS

| DE | 100 31 002 A1 | 1/2002 |
| JP | 2003-298143 A | 10/2003 |
| WO | WO 00/31809 A | 6/2000 |

\* cited by examiner

*Primary Examiner*—Fernando L Toledo
*Assistant Examiner*—Swapneel Chhaya
(74) *Attorney, Agent, or Firm*—Edell, Shapiro & Finnan, LLC

(57) ABSTRACT

A magnetoresistive memory cell includes a tunnel barrier region between first and second electrode devices. The first electrode device includes a natural antiferromagnet region. A diffusion barrier region is formed in the first electrode device and serves as a chemical and/or physical transformation region of a surface region or interface region between the tunnel barrier region and the natural antiferromagnet region.

10 Claims, 5 Drawing Sheets

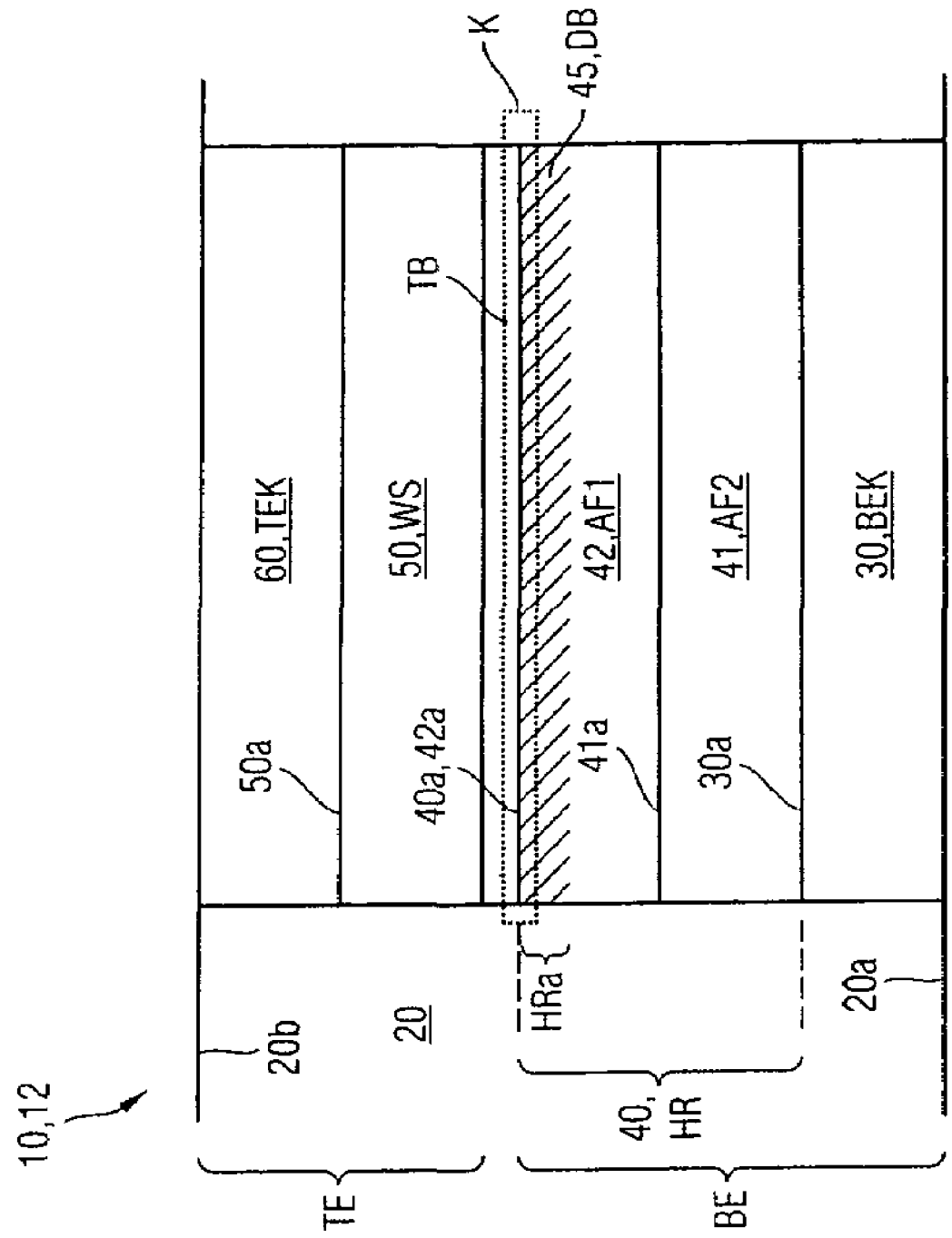

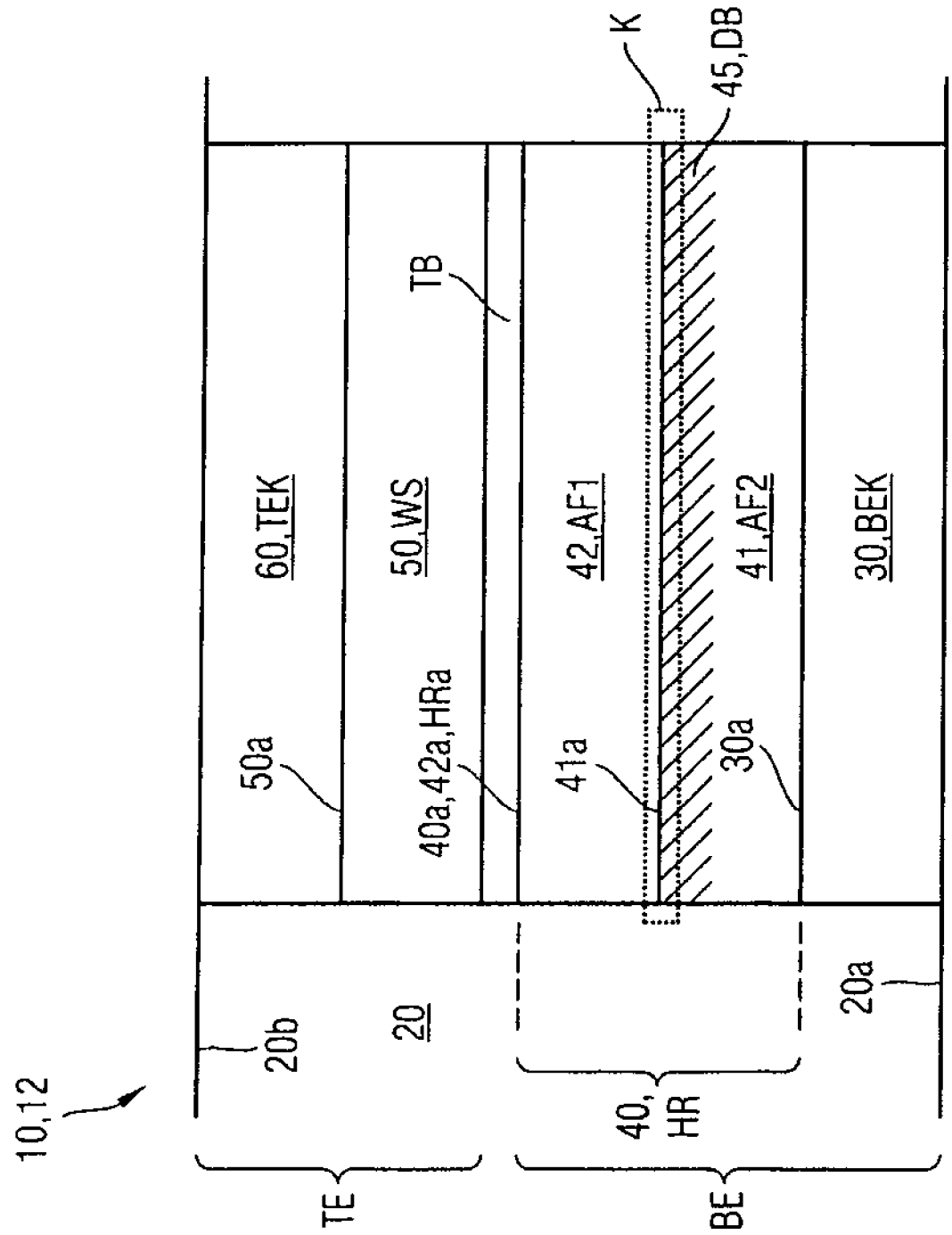

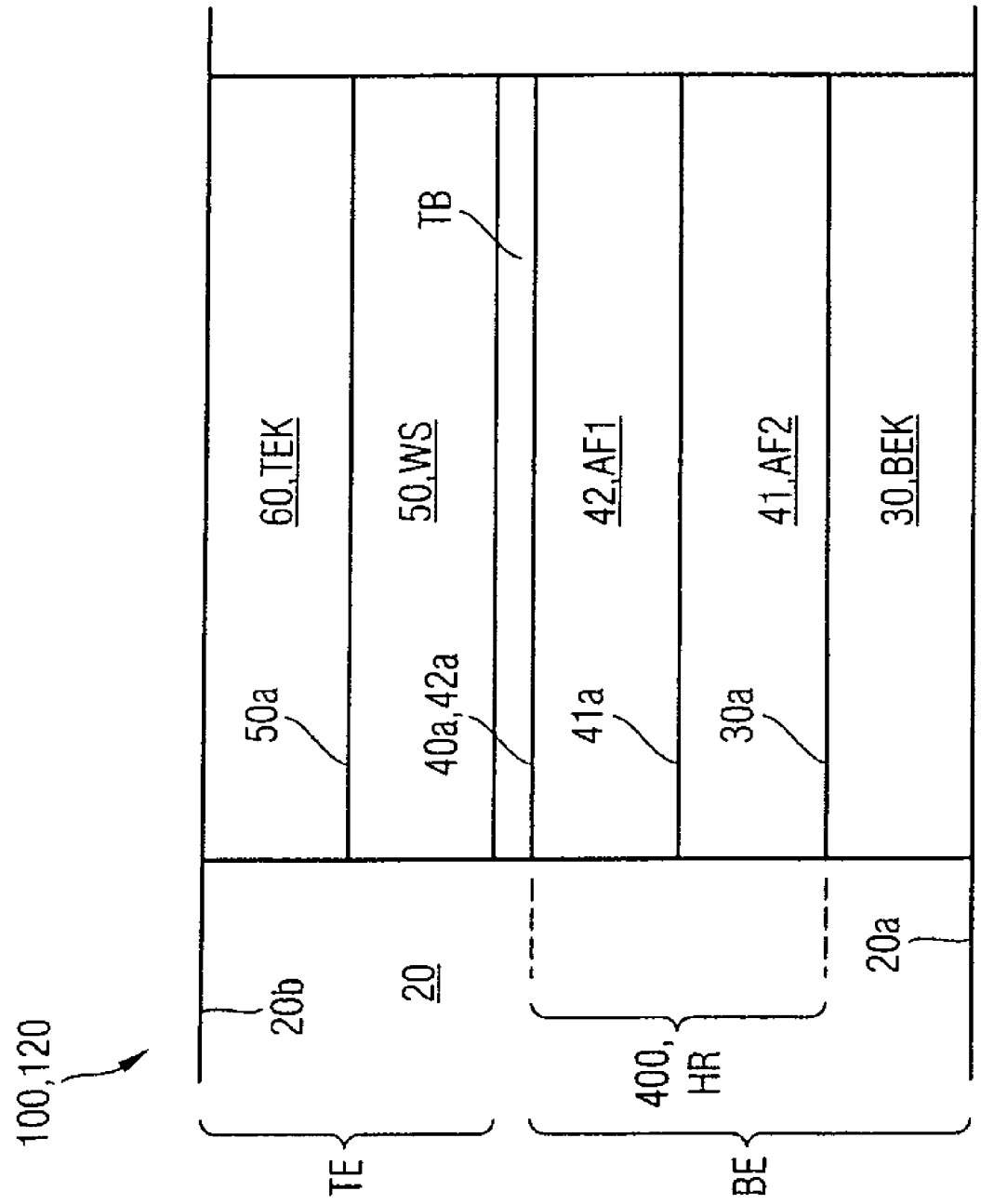

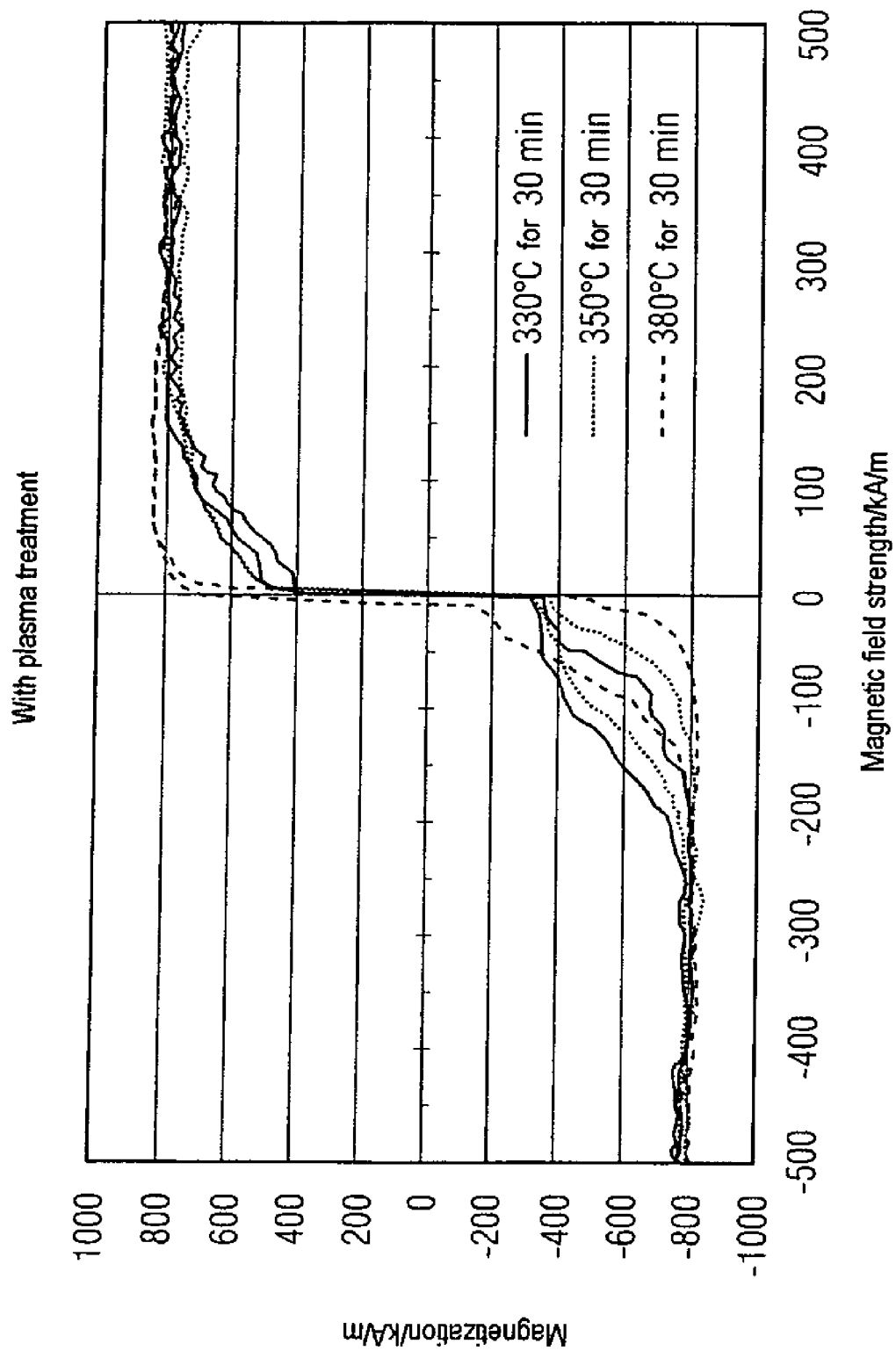

MAGNETORESISTIVE MEMORY CELL AND PROCESS FOR PRODUCING THE SAME

CROSS REFERENCE TO RELATED APPLICATIONS

This application is a continuation of PCT/DE2004/002395, filed Oct. 27, 2004, and titled "Magnetoresistive Memory Cell And Method For Producing The Same," which claims priority to German Application No. DE 103 50 161.4, filed on Oct. 28, 2003, and titled "Magnetoresistive Memory Cell And Process For Producing It," the entire contents of which are hereby incorporated by reference.

FIELD OF THE INVENTION

The invention relates to a magnetoresistive memory cell.

BACKGROUND

In magnetoresistive memory cells and in processes for producing them, a first, lower or bottom electrode device and a second, upper or top electrode device, with a tunnel barrier region between them, are provided in this order as storage element. The first, lower or bottom electrode device is formed with a hard-magnetic reference region having a region comprising or consisting of a natural antiferromagnet.

In operation, depending on the orientation of the magnetizations of the hard-magnetic reference region and of the soft-magnetic storage region of the top electrode device, a tunneling resistance, which is dependent on this mutual orientation of the magnetizations, can be determined by measuring a flow of current between the bottom electrode and the top electrode when a potential is applied and can be used to derive an information state or memory content, is established between the bottom electrode and the top electrode via the tunnel barrier region.

Important requirements for magnetoresistive memory cells are firstly magnetic coupling or interaction which is as direct as possible within the hard-magnetic reference region and/or the individual layers of the hard-magnetic reference region with respect to one another and magnetic coupling which is as weak as possible in the transition region between the hard-magnetic reference region and the soft-magnetic storage region, i.e. in the tunnel barrier region, by which the tunneling resistance is substantially defined.

At the same time, a magnetoresistive memory cell, and in particular the arrangement of the various layers provided as the storage element, should have the minimum possible geometric dimensions, so that the minimum possible amount of space is lost and therefore a high integration density can be achieved. Furthermore, it is also intended to ensure a particularly long operational reliability and data retention time.

In known magnetoresistive memory cells, however, it has been found that it is difficult to satisfy all these conditions simultaneously.

SUMMARY

The invention provides a magnetoresistive memory cell and a method for producing it, in which a magnetoresistive storage effect can be utilized to the maximum possible benefit within the smallest possible space and with a high operational reliability.

An important aspect of the magnetoresistive memory cell according to the invention is that a diffusion barrier region is formed between the tunnel barrier region and the region comprising the natural antiferromagnet, in a surface region of the hard-magnetic reference region or in a transition region in the hard-magnetic reference region, as a chemical and/or physical transformation region of at least part of the surface region of the hard-magnetic reference region or of the transition region in the hard-magnetic reference region.

Therefore, it is a core concept of the present invention that in the magnetoresistive memory cell according to the invention a diffusion barrier region be formed or provided as chemical and/or physical transformation region of at least part of the surface of the reference region or of an interface in the reference region, facing the tunnel barrier. This ensures intimate magnetic and/or mechanical contact between the reference region and the tunnel barrier region, since there are no additional material constituents or layers introduced between these two layers which magnetically interact with one another. In addition, a material transition between the directly adjacent layers caused by diffusion of substance is prevented in operation and/or during production. Therefore, there is no material influencing between the reference region and the tunnel barrier region. Furthermore, an additional influencing of the tunnel barrier region is also avoided, so that even tunneling operations taking place in the transition region or in the interface between the hard-magnetic reference region and the soft-magnetic storage region, and in particular the tunneling resistance which is formed there, remains substantially uninfluenced.

This core concept can also be considered independently of a magnetoresistive memory cell, e.g., with a view to a storage element which has been modified in accordance with the invention, or a TMR stack which has been modified in accordance with the invention or a TMR element which has been modified in accordance with the invention, as can also be used in areas other than memories, e.g., in sensors.

In an advantageous refinement of the magnetoresistive memory cell according to the invention, it is provided that the chemical and/or physical transformation region and/or the diffusion barrier region are formed so as to extend laterally over the entire surface region of the hard-magnetic reference region or over the entire contact region, transition region and/or interfacial region in the reference region.

In another embodiment of the magnetoresistive memory cell according to the invention, it is provided that the region comprising the natural antiferromagnet is further comprises manganese.

In a further embodiment, it is provided, as an alternative or in addition, that the chemical and/or physical transformation region and/or the diffusion barrier region is formed as a layer which blocks the diffusion of manganese. In particular, this measure prevents reciprocal contamination between the reference region and the tunnel barrier region or of the transition region between these regions, or at least reduces such contamination to such an extent that respective magnetic coupling and the tunneling properties in the transition region of the tunnel barrier region are particularly well stabilized.

Numerous process engineering procedures are suitable for forming the chemical and/or physical transformation region as a diffusion barrier region:

In an exemplary embodiment of the magnetoresistive memory cell according to the invention, it is provided that the chemical and/or physical transformation region and/or the diffusion barrier region are formed as a plasma-treated surface region, or interfacial region, or as a plasma-treated surface layer, or interfacial layer. In this case, this structure can be formed on the basis of a plasma which contains nitrogen or on the basis of a plasma which is based on nitrogen.

As an alternative or in addition, it may be provided that the structure is formed on the basis of a plasma which contains or is based on inert gases, for example argon or krypton, and/or reactive gases, for example oxygen.

According to an advantageous refinement of the magnetoresistive memory cell according to the invention, it is provided that the chemical and/or physical transformation region and/or the diffusion barrier region are formed as an interfacial region or surface region which has undergone, or been bombarded with, a low-energy treatment with at least one plasma component, or as a corresponding interfacial layer or surface layer.

It is particularly advantageous if the hard-magnetic reference region has a first antiferromagnetic or reference layer region and, for stabilization, the region comprising or consisting of the natural antiferromagnet magnetically coupled to it as second antiferromagnetic or stabilization layer region.

In an alternative embodiment of the magnetoresistive memory cell according to the invention, it is provided that the first antiferromagnetic or reference layer region is formed in such a way as to comprise or consist of a synthetic antiferromagnet, in particular as a system comprising a plurality of layers.

Furthermore, as an alternative or in addition, it is provided that the first antiferromagnetic or reference layer region comprises at least one hard-magnetic layer.

In addition or as an alternative, it is provided that the natural antiferromagnet comprises iridium manganate (IrMn) and/or comprises platinum manganate (PtMn).

In another preferred embodiment of the magnetoresistive memory cell according to the invention, the region comprising the natural antiferromagnet adjoins the hard-magnetic reference region which adjoins a first electrode contact of the first electrode device and in particular is disposed away from the tunnel barrier region. This arrangement prevents contamination and/or chemical or physical influencing of the tunnel barrier region.

The process for producing a magnetoresistive memory cell is distinguished by the fact that a diffusion barrier region is formed between the tunnel barrier region and the region comprising the natural antiferromagnet, in a surface region of the hard-magnetic reference region or in a transition region in the hard-magnetic reference region, as a chemical and/or physical transformation region of at least part of the surface region of the hard-magnetic reference region or of the transition region in the hard-magnetic reference region.

In this case, it is provided that at least one material region for the reference region is formed and/or patterned. Then, the chemical/physical transformation of at least part of the surface region of the reference region or of the transition region in the hard-magnetic reference region is performed. Subsequently, a material region, for the tunnel barrier region, is formed and/or patterned on the material region, for the hard-magnetic reference region.

According to a refinement of the method according to the invention, the chemical and/or physical transformation region and/or the diffusion barrier region are formed so as to extend laterally over the entire surface region of the hard-magnetic reference region or over the entire transition region in the hard-magnetic reference region.

It is preferable that the region comprising the natural antiferromagnet further comprises manganese.

As an alternative or in addition, the chemical and/or physical transformation region and/or the diffusion barrier region is a layer that blocks the diffusion of manganese.

Furthermore, as an alternative or in addition, the chemical and/or physical transformation region and/or the diffusion barrier region are formed as a plasma-treated surface region or interfacial region or as a plasma-treated surface layer or interfacial layer.

This is performed using a plasma containing nitrogen or is based on nitrogen. In addition or as an alternative, the plasma may contain or be based on inert gases, e.g., argon or krypton, and/or reactive gases, e.g., oxygen.

In this case, the plasma is ignited in the vicinity of the surface region of the material region that has been formed for the reference region. Subsequently, a voltage is applied as to lead to low-energy bombardment of the material layer or material region for the reference region.

Therefore, it can be provided that the chemical and/or physical transformation region and/or the diffusion barrier region are formed as an interfacial region or surface region which has undergone or been bombarded with a low-energy treatment with at least one plasma component, or as a corresponding interfacial layer or surface layer.

It is advantageous if the hard-magnetic reference region is formed with a first antiferromagnetic or reference layer region and, for stabilization, is formed with the region comprising the natural antiferromagnet being magnetically coupled as a second antiferromagnetic or stabilization layer region.

In an alternative embodiment of the method according to the invention for producing a magnetoresistive memory cell, it is alternatively or additionally possible to provide that the first antiferromagnetic or reference layer region is formed comprising a synthetic antiferromagnet, in particular as a system comprising a plurality of layers.

Furthermore, as an alternative or in addition, it is provided according to the invention that the first antiferromagnetic or reference layer region comprises at least one hard-magnetic layer.

Furthermore, as an alternative or in addition, the natural antiferromagnet comprises iridium manganate (IrMn) or platinum manganate (PtMn).

In another embodiment of the method according to the invention, the second antiferromagnetic, or stabilization layer region, adjoins the hard-magnetic reference region that adjoins a first electrode contact of the first electrode device, and is disposed away from the tunnel barrier region.

The following text provides a more detailed explanation with regards to specific aspects of the present invention in other words:

The present invention relates to a method for improving the thermal stability of MRAM storage layers or of TMR sensor components.

The thermal stability of TMR layer systems, in which a natural antiferromagnet is used for magnetic stabilization of the reference layer, is relatively low, e.g., a stability temperature of below 330° C. being the determining factor. This is due to the destruction of the coupling or magnetic coupling occurs at elevated temperatures, e.g., as a result of diffusion, probably of manganese.

To avoid this problem, conventional methods use processes in which the working temperatures are kept well below this critical limit temperature of 330° C. or exceed the limit temperature for only a short time.

Therefore, according to the invention, a nitrogen based plasma is ignited in the vicinity of the surface, for a short time after the deposition of the natural antiferromagnet, that comprises IrMn or of PtMn, and that a voltage be applied to the substrate effecting low-energy bombardment of the layer. This leads to a change in the surface of the IrMn or the PtMn. Consequently, a layer which blocks the diffusion of manganese is formed. The important factor in this context is that the surface is not excessively damaged, thus ensuring no adverse effect on the coupling of the magnet layers subsequently to be applied.

The present invention therefore describes a solution approach, inter alia, to problems in the production of MR components, in particular based on TMR or GMR effects:

Because a particularly magnetically hard reference electrode or reference layer is required in these components, it is customary to opt for a system which is coupled to a natural antiferromagnet by exchange coupling. These systems are also known as exchange bias systems. However, materials of this type generally contain manganese, e.g., FeMn, IrMn, PtMn, PtPdMn, etc. The diffusion of the manganese is generally deemed responsible for the poor thermal stability of reference layers of this type. This manifests itself, e.g., in the fact that process temperatures generally have to be below 330° C., in which context, higher temperatures can only be used for a very short time. However, this procedure in terms of the temperature regime is often not entirely process-compatible.

To avoid irreversibilities when writing, with regard to the interaction with the adjacent domains, it is desirable that only rotary movements be provided for the magnetization in the flux layer.

The invention proposes a method which is able to increase the thermal stability in components of this type.

The obvious solution, e.g., the provision of a diffusion barrier in the form of an additional, explicit and separate tantalum layer on the hard-magnetic reference layer is not expedient, since each additional layer has a disadvantageous and undesirable influence on the interlayer coupling since it would lead to a reduced magnetic stability of the reference layer.

Therefore, the invention proposes, inter alia, a modification to the surface of the natural antiferromagnet. This modification is formed and controlled in such a manner that the surface serves as a diffusion barrier. However, the coupling of the subsequent layers remains, to the extent possible, unaffected and retained.

One proposed way of achieving this is, e.g., the bombarding of the surface of the natural antiferromagnet by ions. In a specific exemplary embodiment, in which following the deposition of PtMn a nitrogen plasma is ignited in the vicinity of the substrate surface, the result is an improvement in the thermal stability by approximately 30 Kelvin.

Alternative plasmas may, e.g., contain inert gases, e.g., argon or krypton, or also reactive gases, e.g., oxygen. In an advantageous refinement, gases which can form compounds with manganese are used. Preference is given to nitrogen, since MnN is a solid which can also form an antiferromagnetic modification form.

Some specific concepts of the invention are explained below in further detail:

An MRAM cell, on which the present invention is based, comprises, e.g., a soft-magnetic storage layer, an insulating and nonmagnetic tunnel barrier, and a hard-magnetic reference layer.

The reference layer may be configured as a single layer or as a layer system. In the latter case, synthetic antiferromagnetic layers, as first antiferromagnetic or reference layer region, are used and their antiferromagnetic coupling properties are exploited.

The thermal stability of the reference layer system can be increased by adding, e.g., a further layer of a natural antiferromagnet, referred to as a second antiferromagnetic or stabilization layer region, to a conventional reference layer system and coupling them. The natural antiferromagnets used often contain manganese Mn, and the thermal stability is adversely affected by diffusion of the manganese out of the natural antiferromagnet, e.g., comprising or consisting of IrMn or PtMn, into the reference layer system or even onward to the tunnel barrier.

In the first case, the magnetic coupling within the reference layer system may be disrupted. In the latter case, the tunneling properties are disrupted, in particular at the interface between the tunnel barrier and the reference region.

One idea of the invention is the introduction of a diffusion barrier as a physically and/or chemically transformed surface region of the natural antiferromagnet, i.e., of the second antiferromagnetic or stabilization layer region.

The memory cell according to the invention comprises a first electrode or bottom electrode and a second electrode or top electrode, with a tunnel barrier being provided between them. The invention relates in particular to the improvement to the first or bottom electrode. This comprises, e.g., a layer system which is formed either by a hard-magnetic single layer or by a synthetic antiferromagnet. In addition or as an alternative, in both these cases it is also possible to provide regions consisting of a natural antiferromagnet for magnetic coupling, i.e., exchange bias. In the case of the combination with a natural antiferromagnet, which contains manganese, stability problems generally arise in subsequent further processing steps, e.g., a heat treatment which is required. The reason for this is that the manganese begins to diffuse out of the natural antiferromagnet at elevated temperatures, e.g., above 330° C. This leads to a deterioration in the magnetic coupling in the synthetic antiferromagnet and/or to a deterioration in the properties of the tunnel barrier, with in particular the magnetic layer of the reference electrode being adversely affected. For example, manganese can disrupt the spin polarization of the reference electrode at the interface with the tunnel barrier. It is also conceivable that manganese may migrate into the barrier, where it generates electrical states, therefore altering the tunneling process.

As has already been explained in detail above, it is an object of the present invention to provide a layer system which prevents or restricts the diffusion of manganese. This is achieved, according to the invention, by virtue of the fact that the manganese source, namely the natural antiferromagnet, is quasi-shielded. The solution according to the invention comprises a diffusion barrier in the form of a physically and/or chemically transformed surface being provided, e.g., on the natural antiferromagnet through ion bombardment. The surface treatment can be effected by incorporation of additional atoms from the plasma, therefore producing a denser microstructure in the surface region.

The diffusion of manganese can be impeded by a modified crystal structure of the top atomic layers of the PtMn.

BRIEF DESCRIPTION OF THE DRAWINGS

In the text which follows, the invention is explained in more detail with reference to the drawings and on the basis of preferred embodiments. In the drawing:

FIGS. 1A and 1B show diagrammatic, sectional side views of two embodiments of the magnetoresistive memory cell according to the invention, FIG. 2 shows a diagrammatic and sectional side view of a conventional magnetoresistive memory cell, and FIGS. 3 and 4 show graphs explaining the thermal properties of a magnetoresistive memory cell according to the invention and a memory cell from the prior art.

DETAILED DESCRIPTION

Figure 3:
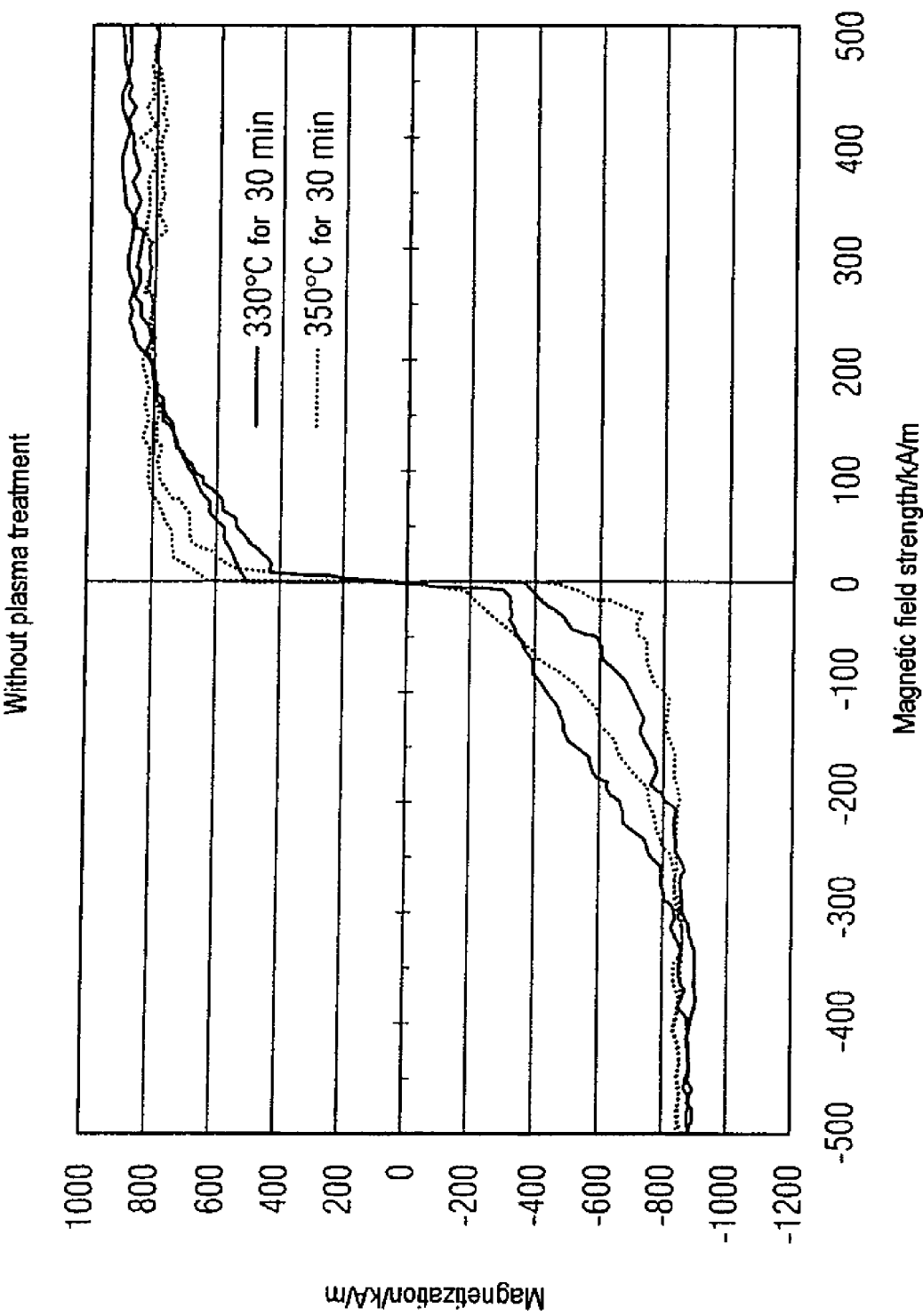

In the text which follows, identical, comparable or similar elements and structures are denoted by the same reference designations, without a detailed description being repeated for each occurrence of these references.

FIG. 1A shows, in the form of a sectional side view, an embodiment of the magnetoresistive memory cell 10 according to the invention. In the embodiment shown in FIG. 1A, this memory cell is formed in a semiconductor substrate region 20. In the region of an underside 20a of the semiconductor substrate region 20, there is provided a material region 30 for the first, i.e., lower or bottom, electrode contact BEK of the first, i.e., lower or bottom, electrode device BE. At a top side 20b of the semiconductor material region 20 there is provided a further material region 60 for the second, i.e., upper or top, electrode contact TEK of the second, i.e., upper or top, electrode device TE.

Between the first electrode contact BEK and the second electrode contact TEK, the storage element 12 has a sequence of layers 40 and 50, the layer region 40 which directly adjoins the first electrode contact BEK forming a hard-magnetic reference region HR, and the material layer 50 which directly adjoins the second electrode contact TEK forming a soft-magnetic storage region WS. The hard-magnetic reference region HR and the soft-magnetic storage region WS are separated from one another by a tunnel barrier region TB, which is nonmagnetic and is substantially electrically insulating.

The hard-magnetic reference region HR comprises a second antiferromagnetic or stabilization layer region AF2, arranged adjacent to the first electrode contact, that comprises: a natural antiferromagnet 41, e.g., IrMn and/or PtMn, that contains manganese Mn, a surface region AF2a, a first antiferromagnetic or reference layer region AF1, that comprises a synthetic antiferromagnet and is arranged between the second antiferromagnetic region AF2 and the tunnel barrier region TB.

The reference region HR and in particular the first antiferromagnetic or reference layer region AF1 and the tunnel barrier region TB are in magnetic contact with one another via a transition region K, contact region K or interfacial region K.

According to the invention, in order to prevent the diffusion of constituents of the second antiferromagnetic region AF2, comprising the natural antiferromagnet 41, into the first antiferromagnetic or reference layer region AF1 or vice versa, a diffusion barrier region DB is provided in the surface region HRa of the first material region 42 of the reference region HR. The diffusion barrier region DB is in the form of a chemically and/or physically transformed layer or surface region 45.

By contrast, in the prior art corresponding to the sectional side view shown in FIG. 2, in the case of a conventional magnetoresistive memory cell 100, at the hard-magnetic reference region 400 the reference region HR is formed in direct mechanical contact with the tunnel barrier region TB.

There, although under certain circumstances a sufficient magnetic coupling is initially formed between a first antiferromagnetic or reference layer region AF1 and the tunnel barrier region TB in their interfacial region K, it is nevertheless also possible for material constituents of the first antiferromagnetic or reference layer region AF1 to pass via this interfacial region K into the tunnel barrier region TB or vice versa, thereby disrupting the magnetic coupling in the interfacial region K and therefore, after diffusion to the tunnel barrier TB, likewise disrupting the tunneling resistance.

The embodiment of the magnetoresistive memory cell 10, 12 according to the invention shown in FIG. 1B substantially corresponds to the embodiment from FIG. 1A, however, with the exception of the following specific features: in the embodiment shown in FIG. 1B, the diffusion region DB is not formed as a chemically and/or physically transformed material region 45 in the surface region HRa of the hard-magnetic reference region 40, HR, but rather as an interfacial region K or interfacial layer K in the surface region 41a of the region AF2 comprising or consisting of the natural antiferromagnet 41.

In both embodiments shown in FIGS. 1A and 1B, the first electrode device BE comprises: a first electrode contact BEK, the surface 30a of the corresponding material region 30, of which is adjoined by the natural antiferromagnet 41 region AF2 for magnetic stabilization, the surface 41a, that is adjoined by the magnetic reference layer 42 region AF1, that has a surface region 42a which simultaneously forms the surface region 40a, HRa of the hard-magnetic reference region HR, 40 as a whole. On the other side, the material layer 50 for the soft-magnetic storage region WS adjoins the tunnel barrier TB, and the surface 50a of this material layer 50 is then in turn adjoined by the material layer 60 for the second electrode contact TEK. The soft-magnetic storage layer or soft-magnetic storage region WS and the second electrode contact TEK together form the second electrode device TE as storage region of the respective memory cell 10, according to the invention, having the storage element 12 comprising: the top electrode device TE, the tunnel barrier region TB and the first electrode device BE.

FIGS. 3 and 4 are graphs which explain the magnetic hysteresis as a function of the process temperature in which the magnetization is functionally dependent on the field strength.

FIG. 3 shows the conditions for a magnetoresistive memory cell without plasma treatment. By contrast, FIG. 4 shows the conditions for a magnetoresistive memory cell with plasma treatment. In this case, therefore, two layer systems are compared with one another, with FIG. 3 explaining the conditions in the prior art, whereas in the embodiment shown in FIG. 4 a plasma treatment was carried out following the deposition of the hard-magnetic reference layer.

Up to the heat treatment temperature of 330° C., the conditions in the prior art and in the embodiment according to the invention are similar and are represented by the solid curves. By contrast, in the prior art the hysteresis profile degenerates when the temperature of the heat treatment is raised to 350° C. and is described by the curve illustrated in dotted form in FIG. 3. By contrast, with the layer arrangement produced in accordance with the invention, no degeneration is yet evident at a heat treatment temperature of 350° C., as represented by the dotted curve shown in that figure. This degeneration only commences at a treatment temperature of approximately 380° C., so that the associated dashed curve in FIG. 4 is then approximately comparable to the dotted curve for the prior art from FIG. 3.

While the invention has been described in detail and with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

LIST OF DESIGNATIONS

10 Magnetoresistive memory cell according to the invention, magnetoresistive stack element according to the invention
12 Storage element according to the invention, TMR stack
20 Semiconductor material region, semiconductor substrate region
20a Underside of the semiconductor material region or semiconductor substrate region
20b Top side of the semiconductor material region or semiconductor substrate region
30 Material region for the lower electrode contact BEK
30a Surface region
40 Material region or material layer for the hard-magnetic reference region HR
40a Surface region
41 First material region or first material layer for the second antiferromagnetic or stabilization layer region
41a Surface region
42 Second material region or second material layer for the first antiferromagnetic or reference layer region
42a Surface region
45 Chemical and/or physical transformation region or transformation material region
50 Material region for the soft-magnetic storage layer WS
60 Material region for the upper electrode contact TEK
100 Conventional magnetoresistive memory cell, conventional magnetoresistive stack
120 Conventional storage element, TMR stack
400 Conventional hard-magnetic layer
AF1 First antiferromagnetic or reference layer region
AF2 Second antiferromagnetic or stabilization layer region
AF2a Surface or surface region of the second antiferromagnetic or stabilization layer region
BE First, lower or bottom electrode device, reference region
BEK First, lower or bottom electrode contact
DB Diffusion barrier region, diffusion barrier
HR Hard-magnetic reference region
HRa Surface region
K Interfacial region, contact region, transition region
TE Second, upper or top electrode device, storage region
TEK Second, upper or top electrode contact
WS Soft-magnetic storage layer

What is claimed is:

1. A magnetoresistive memory cell, comprising:
a first electrode device comprising a hard-magnetic reference region, including a natural antiferromagnet region comprising a natural antiferromagnet;
a second electrode device;
a tunnel barrier region between the first and second electrode devices; and
a diffusion barrier region disposed between the tunnel barrier region and the natural antiferromagnet region or in a contact region in the hard-magnetic reference region, or in a transition region in the hard-magnetic reference region, or in an interface region in the hard-magnetic reference region, the diffusion barrier region comprising a chemical and/or physical transformation region of at least part of a surface region of the hard-magnetic reference region or of the contact region, transition region, or interface region.

2. The magnetoresistive memory cell according to claim 1, wherein the diffusion barrier region extends laterally over an entirety of the surface region, contact region, transition region, or interface region.

3. The magnetoresistive memory cell according to claim 1, wherein the natural antiferromagnet region comprises manganese.

4. The magnetoresistive memory cell according to claim 3, wherein the diffusion barrier region blocks the diffusion of manganese.

5. The magnetoresistive memory cell according to claim 1, wherein the diffusion barrier region comprises a plasma-treated surface region, interface region, surface layer, or interface layer.

6. The magnetoresistive memory cell according to claim 1, wherein the hard-magnetic reference region comprises a first antiferromagnetic region, wherein the natural antiferromagnet region is a second antiferromagnetic region and is magnetically coupled to the first antiferromagnetic region.

7. The magnetoresistive memory cell according to claim 6, wherein the first antiferromagnetic region comprises a synthetic antiferromagnet comprising a plurality of layers.

8. The magnetoresistive memory cell according to claim 6, wherein the first antiferromagnetic region comprises at least one hard-magnetic layer.

9. The magnetoresistive memory cell according to claim 1, wherein the natural antiferromagnet comprises at least one of IrMn and PtMn.

10. The magnetoresistive memory cell according to claim 1, wherein the natural antiferromagnet region is formed adjacent a first electrode contact of the first electrode device and faces away from the tunnel barrier region.

* * * * *